(12) United States Patent
Tsai et al.

(10) Patent No.: US 6,495,446 B1
(45) Date of Patent: Dec. 17, 2002

(54) LOSSLESS MICROSTRIP LINE IN CMOS PROCESS

(75) Inventors: Chaochieh Tsai, Hsin-chu (TW); Shyhchyi Wong, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/771,187

(22) Filed: Jan. 29, 2001

(51) Int. Cl.[7] .......................................... H01L 21/4763
(52) U.S. Cl. ....................... 438/622; 438/637; 438/657; 438/687
(58) Field of Search .................... 438/618, 622, 438/637, 657, 687

(56) References Cited

U.S. PATENT DOCUMENTS

| | | | |
|---|---|---|---|
| 5,057,798 A | 10/1991 | Moye et al. .................. 333/33 |
| 5,504,466 A | 4/1996 | Chan-Son-Lint et al. ... 333/159 |
| 5,585,288 A | 12/1996 | Davis et al. .................. 437/38 |
| 6,180,445 B1 * | 1/2001 | Tsai ............................ 438/238 |
| 6,295,721 B1 * | 10/2001 | Tsai ............................ 29/623 |

* cited by examiner

Primary Examiner—Kevin M. Picardat
(74) Attorney, Agent, or Firm—George O. Saile; Stephen B. Ackerman; William J. Stoffel

(57) ABSTRACT

A method and structure for a device with a signal line over a semiconductor structure where the signal line is formed over the ground plane, passivation layer, and polyimide layer. We provide a semiconductor structure comprising a substrate having devices formed thereover and a plurality of insulating and conductive layers thereover. Next, we form ground plane over the semiconductor structure. The ground plane is the top metal layer over an inter metal dielectric layer. We then form a passivation layer over the ground plane. We form a first dielectric (e.g., polyimide) layer over the passivation layer. Subsequently, we form a signal line over the first dielectric layer. The signal line is formed by a plating or printing. We form a second dielectric layer (e.g., polyimide) over the signal line and the first dielectric layer.

13 Claims, 3 Drawing Sheets

FIG. 1 – Prior Art

LOSSLESS MICROSTRIP LINE IN CMOS PROCESS

BACKGROUND OF INVENTION

1) Field of the Invention

This invention relates generally to fabrication of semiconductor devices and more particularly to the fabrication of a microwave microstrip line and/or signal line in a conventional CMOS process.

2) Description of the Prior Art

Conventional devices have the signal lines (e.g., microwave microstrip lines) near the silicon substrate. The signal lines generate e-fields near the substrate that are a problem. Due to the Si-substrate's characteristic to dissipate energy (from the e-fields), it is difficult to fabricate a microwave microstrip line (or signal line) in the conventional CMOS process.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,504,466 (Chan-Son-Lint et al.) teaches a method that forms a microwave shifter "strip".

U.S. Pat. No. 5,057,798 (Moye et al.) shows a mircostrip/ground plane on the bottom of a substrate.

U.S. Pat. No. 5,585,288 (Davis) shows a ground plane conductor.

SUMMARY OF THE INVENTION

It is an object of the present invention to provide a method for fabricating a signal line as the top metal layer.

It is an object of the present invention to provide a method for fabricating a signal line (and/or a microstrip) as the top metal layer on top of a lossless polyimide.

To accomplish the above objectives, the present invention provides a method for fabricating a signal line (and/or microstrip) as the top metal layer on top of a lossless polyimide layer which is characterized as follows.

We provide a semiconductor structure comprising a substrate having devices formed thereover and a plurality of insulating and conductive layers thereover. Next, we form ground plane over the semiconductor structure. We then form a passivation layer over the ground plane. We form a first dielectric (e.g., polyimide) layer over the passivation layer. Subsequently, we form a signal line over the first dielectric layer. The signal line is formed by a plating or printing a material selected from the group consisting of Au, Cu and Pt. We form a second dielectric layer (e.g., polyimide) over the signal line and the first dielectric layer.

In operation, the signal line generates electrical magnetic fields. These electrical magnetic fields are stopped by the first dielectric layer (e.g., polyimide) and the top metal layer (e.g., ground plane).

The invention has the following benefits: 1) can put active devices underneath the signal line which reduces chip size and 2) no backside polishing of the wafer is needed to thin the wafer.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

A. Problem Invention Solves

Figure 1:
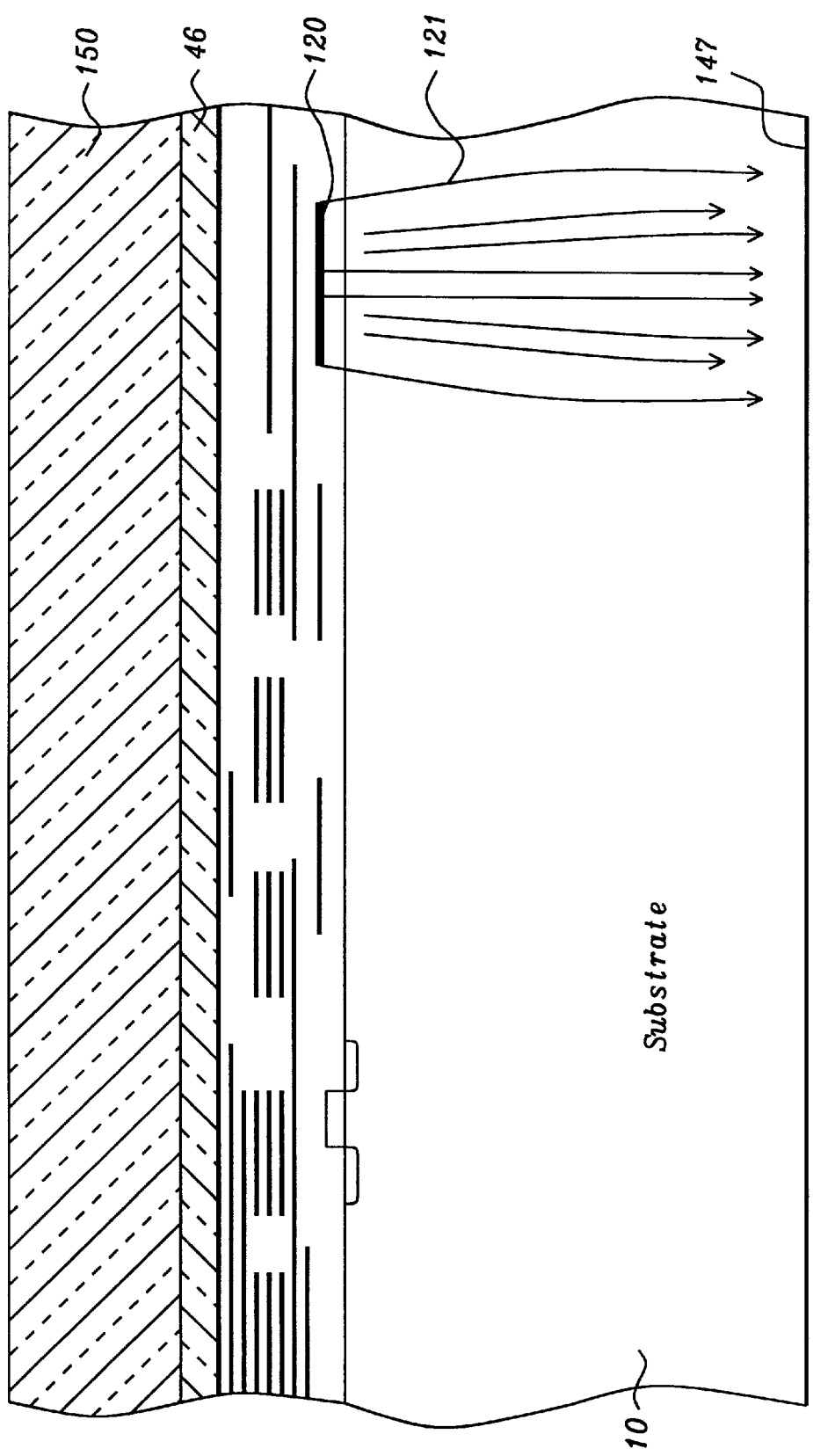
FIG. 1 shows a cross sectional view of a device having the signal line (microstrip) as a conductive line (near the substrate) except for the top metal line according to the prior art.

Referring now to the drawings and more particularly to FIG. 1, there is shown a structure known to the inventors over which the present invention is an improvement. It is to be understood in this regard that no portion of FIG. 1 is admitted to be prior art for patentability of the present invention. Rather, this highly simplified diagram is an effort to provide an improved understanding of the problems that are overcome by the invention.

FIG. 1 shows a silicon substrate 10 and conductive lines over the substrate. The first level conductive line 120 (e.g., M1) is used as a signal line. FIG. 1 shows the electric field 121 generated by the signal line 120. In processes known to the inventor, the signal lines are formed in a conductive line over the substrate but the signal line is not the top metal line. The backside of the substrate is polished back so that the silicon substrate is only about 250 Å thick. Next, ground plane 147 is formed on the backside of the substrate 10.

B. Description of a Preferred Embodiment of the Invention

The invention is a structure for a signal line (transmission line) that placed over the wafer, over the metal line and inter metal dielectric layers, above the ground plane, above the polyimide layer. The invention has the following features (See FIG. 1):

1. use high conductive top metal 42 as transmission line ground plane.
2. use lossless polyimide 50 which was deposited on the top of passivation layer as transmission line dielectric layer.
3. use metal layers (Au, Cu, Pt, and etc) which was plated or printed on top of polyimide as signal line 60.
4. use signal line 60 and ground plane 42 to confine the EM wave 61 in the lossless polyimide 50 to avoid the dissipation loss of Si-substrate 10.

Figure 2:
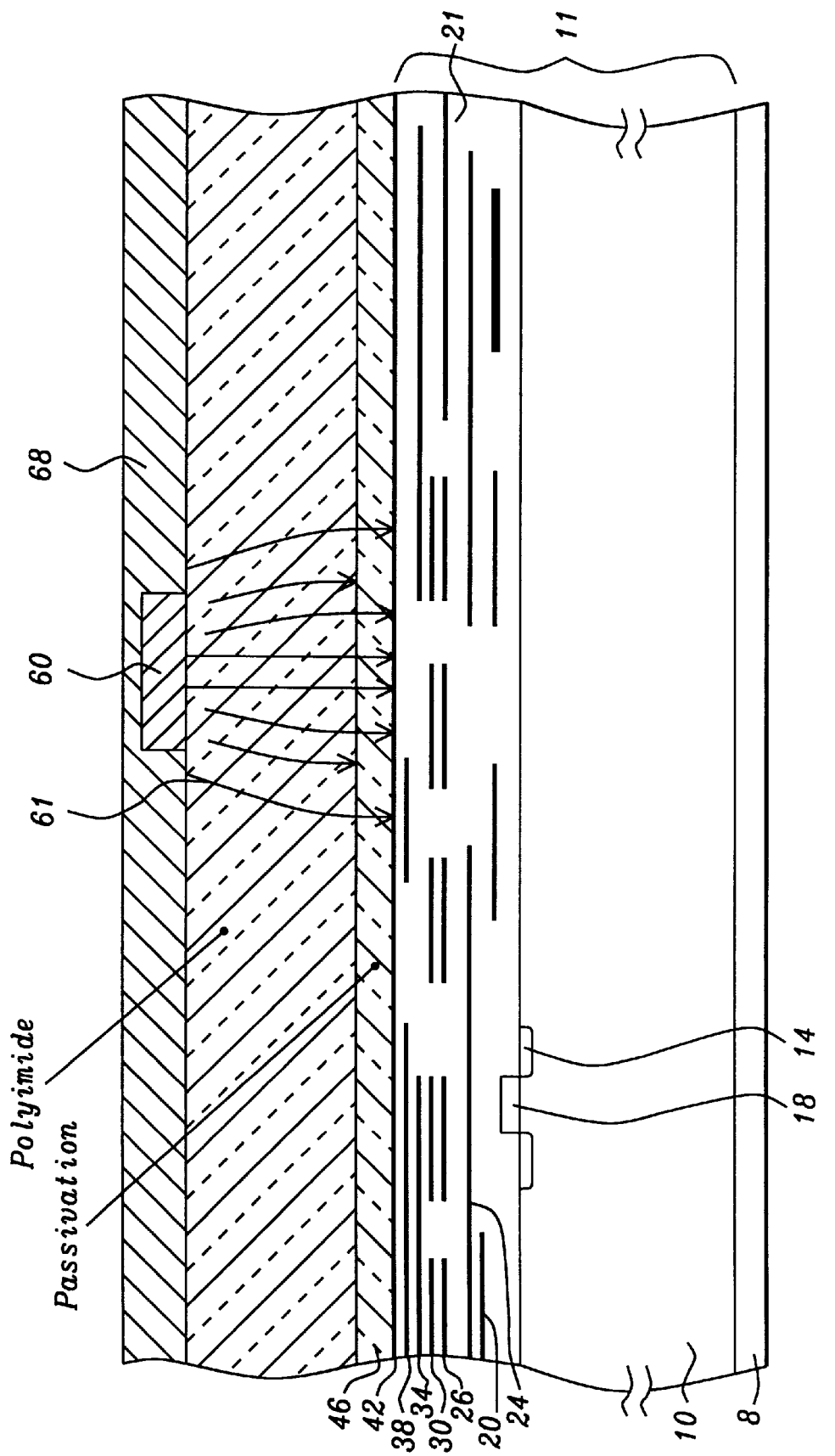
FIG. 2 is a cross sectional view of a device the ground plane as the top metal line and the signal line (microstrip) as a conductive line over the dielectric (e.g., polyimide) layer according to the present invention.

C. FIG. 2—Invention's Signal Line

As shown in FIG. 2, we provide a semiconductor structure 11 comprising a substrate 10 having devices 14 18 formed thereover and/or therein and a plurality of insulating and conductive layers thereover. The substrate preferably has a resistivity between 10 and 20 Ohm-cm. This is very important because the very conductive substrate can dissipate energy quickly. Therefore the signal is not propagated well. The signal from the microwave microstrip is attenuated in a short distance.

The plurality of insulating and conductive layers preferably has at least 5 insulating layers and 5 conductive layers. The plurality of conductive lines 24 26 30 34 38 represent the poly lines, and/or metal lines. The plurality of insulating layers 21 interlevel dielectric layer (ILD) and inter metal dielectric (IMD) layers. These conductive and insulating layers are formed under the passivation layer and polyimide layers typically used in chip making. This is the typical CMOS processing.

Next, we form simultaneously form a ground plane 42 and top metal lines (not shown) over the semiconductor structure 11. The ground plane is formed in the same processing step (e.g., metal deposition/patterning) as the top metal layer (e.g., M5 layer in a 5 metal layer structure). The top metal lines are formed in other areas than the area where the ground plane is formed. No other metal lines are formed between the top metal layer and the passivation layer. The ground plane is the top metal layer over an inter metal dielectric (IMD) layer. The top metal layer preferably covers an area at least 3 times as wide as the overlying signal (transmission) line 60.

We then form a passivation layer 46 over the ground plane 42. The passivation layer is preferably comprised of oxide and silicon nitride (SiN) and preferably the oxide layer has a thickness of between about 5 and 15 K Å and the SiN layer preferably has thickness between 1 and 5 K Å. The passivation layer is under and in contact with the overlying first dielectric layer (e.g., polyimide) layer.

We form a first dielectric (e.g., polyimide) layer 50 over the passivation layer 46. The first dielectric (e.g., lossless polyimide) layer 50 is preferably comprised of polyimide or a lossless dielectric. A "Lossless" material is an about pure insulator whose conductivity is about zero. The first dielectric (polyimide) layer 50 is most preferably comprised of polyimide and has a thickness of between about 20 and 50 $\mu$m.

Subsequently, we form a signal line 60 (e.g., transmission line) over the first dielectric layer 50. A signal line is used to propagate signals. A microstip is a structure comprised of a 1) signal line on a insulator (e.g., 50) and a underlying conductor (e.g., 42)

The signal line 60 (e.g., transmission line, microwave microstrip line) is formed by a plating or printing process of Au, Cu, Al and Pt and is most preferably made of Cu. The signal line preferably has a width between 6 and 30 $\mu$m, and a thickness between 4 and 18 $\mu$m. FIG. 2 shows electrical magnetic fields 61 generated by the signal line. The electric fields are stopped at the conductor 42. A microwave microstrip has microwave frequency signals passing through it.

We form a second dielectric layer (e.g., polyimide) 68 over the signal line and the first dielectric layer 50. The second dielectric (e.g., polyimide) layer 68 is preferably comprised of polyimide. The second dielectric (polyimide) layer 68 is preferably comprised of polyimide and has a thickness of between about 20 and 50 $\mu$m.

The ground plane 8 is preferably formed on the back of the substrate 10 after the layers 10 to 68 are formed on the front side. Preferably the IC finish process are performed, then the backside is lapped (polished) and then coated with Al to form the ground plane 8.

Key features/benefits of the invention shown in FIG. 2 include: a) reduced microstrip line attenuation, b) allows active devices to exist under microstrip lines and c) reduced cell size.

Figure 3:
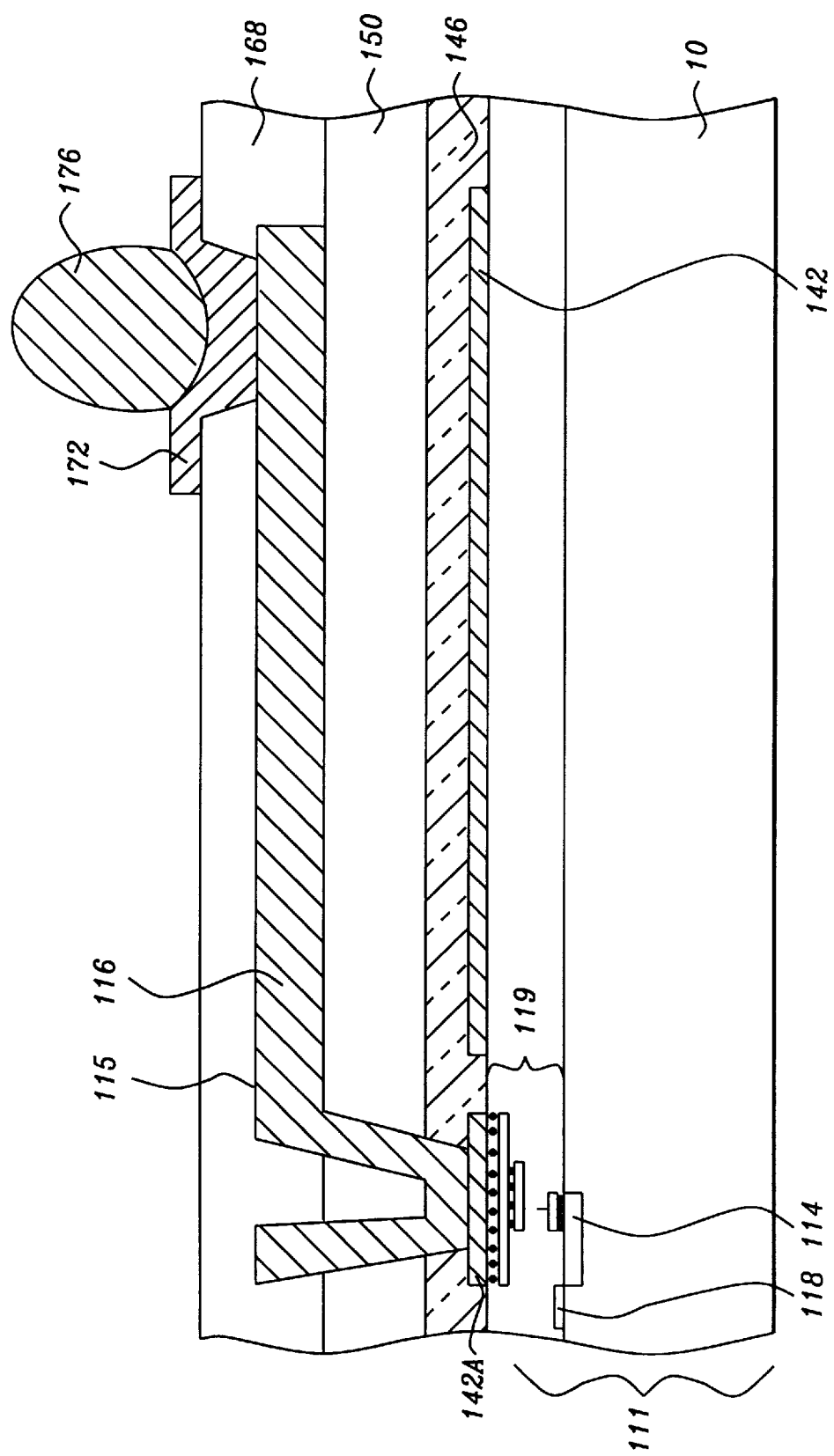
FIG. 3 is a cross sectional view of a device the ground plane as the top metal line and the signal line (microstrip) as a conductive line over the first dielectric (e.g., polyimide) layer 50 according to the present invention.

D. FIG. 3—Signal Line and Via

FIG. 3 shows a cross section of an embodiment the structure of the invention. A wafer 10 has devices 114 118 formed therein and thereon. A plurality of conductive and insulating layers 119 are formed over the substrate 10. The plurality of conductive and insulating layer 119 represent the poly lines, metal lines, interlevel dielectric layer (ILD) and inter metal dielectric (IMD) layers.

A top metal layer 142 (e.g., ground layer) is formed over the plurality of conductive and insulating layer 119. In the same deposition step, a ground plane 42 and a first top metal line 142A are formed over said semiconductor structure 11. The ground plane is the top conductive line. The top metal line 142A is connected to at least on of said plurality of conductive layers.

A passivation layer 146 is formed over the top metal layer 142.

A first dielectric (polyimide) layer 150 is formed over the passivation layer 146.

A signal line 116 is formed over the first dielectric (polyimide) layer 150.

A metal via 115 is formed contacting the top metal line (ground layer) 142 and the signal line 116. The metal via 115 is larger than conventional to connect the transmission line to the devices.

A second dielectric layer 168 is formed over the metal via 115 and the signal line 116.

A hole is formed in the second dielectric layer 168 to expose the signal line 116. An under layer 172 is formed in a hole. A bump or ball 176 is formed on the under layer 172.

The invention reduces resistance of the connection between the microstrip line and the normal interconnects.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a device with a signal line; comprising the steps of:

a) providing a semiconductor structure comprising a substrate having devices formed therein and a plurality of insulating and conductive layers thereover;

b) forming simultaneously a ground plane and top metal lines over said semiconductor structure;

c) forming a passivation layer over said ground plane and said top metal lines;

d) forming a first dielectric layer over said passivation layer;

e) forming a signal line over said first dielectric layer;

f) forming a second dielectric layer over said signal line and said first dielectric layer.

2. The method of claim 1 wherein said substrate has a resistivity between 10 and 20 Ohm-cm.

3. The method of claim 1 wherein said plurality of insulating and conductive layers has at least 5 insulating layers and 5 conductive layers.

4. The method of claim 1 wherein said first dielectric layer is comprised of polyimide.

5. The method of claim 1 wherein said first dielectric layer is comprised of polyimide and has a thickness of between about 20 and 50 μm.

6. The method of claim 1 wherein said signal line is formed by plating or printing a material selected from the group consisting of Au, Cu and Pt.

7. The method of claim 1 wherein said second dielectric layer is comprised of polyimide.

8. The method of claim 1 wherein said second dielectric layer is comprised of polyimide and has a thickness of between about 8 and 20 μm.

9. The method of claim 1 wherein said passivation layer is comprised of an oxide layer and a silicon nitride layer; and the oxide layer has a thickness of between about 5 and 15 K Å and the silicon nitride layer has thickness between 1 and 5 K Å.

10. A method of fabricating a device with a signal line; comprising the steps of:

a) providing a semiconductor structure comprising a substrate having devices formed therein and a plurality of insulating and conductive layers thereover;
   (1) said plurality of insulating and conductive layers has at least 5 insulating layers and 5 conductive layers;

b) forming in the same deposition step a ground plane and a first top metal line over said semiconductor structure; said ground plane is the top conductive line; said top metal line is connected to at least one of said plurality of conductive layers;

c) forming a passivation layer over said ground plane;
   (1) said passivation layer is comprised of an oxide layer and a silicon nitride layer; and the oxide layer has a thickness of between about 5 and 15 K Å and the silicon nitride layer has thickness between 1 and 5 K Å;

d) forming a first dielectric layer over said passivation layer;
   (1) said first dielectric layer is comprised of polyimide and has a thickness of between about 20 and 50 μm;

e) forming a signal line over said first dielectric layer;
   (1) said signal line is formed by plating or printing a material selected from the group consisting of Au, Cu and Pt;

f) forming a second dielectric layer over said signal line and said first dielectric layer;
   (1) said second dielectric layer is comprised of polyimide;
   (2) said second dielectric layer is comprised of polyimide and has a thickness of between about 8 and 20 μm.

11. The method of claim 10 which further after step (e) and before step (f) includes forming a metal via contacting said first top metal line and said signal line.

12. The method of claim 10 wherein said substrate has a resistivity between 10 and 20 Ohm-cm.

13. A method of fabricating a device with a signal line; comprising the steps of:

a) providing a semiconductor structure comprising a substrate having devices formed therein and a plurality of insulating and conductive layers thereover;
   (1) said plurality of insulating and conductive layers has at least 5 insulating layers and 5 conductive layers;

b) forming in the same deposition step a ground plane and a first top metal line over said semiconductor structure; said ground plane is the top conductive line; said top metal line is connected to at least one of said plurality of conductive layers;

c) forming a passivation layer over said ground plane;

d) forming a first dielectric layer over said passivation layer;

e) forming a signal line over said first dielectric layer;

f) forming a second dielectric layer over said signal line and said first dielectric layer.

* * * * *